US012687349B2

(12) United States Patent
Lee et al.

(10) Patent No.: US 12,687,349 B2
(45) Date of Patent: Jul. 21, 2026

(54) IMMERSION-TYPE LIQUID COOLING HEAT DISSIPATION STRUCTURE

(71) Applicant: AMULAIRE THERMAL TECHNOLOGY, INC., New Taipei City (TW)

(72) Inventors: Kuo-Wei Lee, New Taipei City (TW); Ching-Ming Yang, New Taipei City (TW); Chi-An Chen, New Taipei City (TW); Tze-Yang Yeh, New Taipei City (TW)

(73) Assignee: AMULAIRE THERMAL TECHNOLOGY, INC., New Taipei City (TW)

( * ) Notice: Subject to any disclaimer, the term of this patent is extended or adjusted under 35 U.S.C. 154(b) by 140 days.

(21) Appl. No.: 18/646,715

(22) Filed: Apr. 25, 2024

(65) Prior Publication Data

US 2024/0295371 A1      Sep. 5, 2024

Related U.S. Application Data

(63) Continuation-in-part of application No. 17/739,150, filed on May 8, 2022, now abandoned.

(51) Int. Cl.
*F28F 13/18*          (2006.01)
*H05K 7/20*          (2006.01)

(52) U.S. Cl.
CPC ....... *F28F 13/187* (2013.01); *H05K 7/20236* (2013.01); *H05K 7/20263* (2013.01)

(58) Field of Classification Search
CPC ............... H05K 7/203; H05K 7/20309; H05K 7/20436; F28F 21/089; F28F 21/084; F28F 21/085; F28F 2260/00; F28D 15/046
See application file for complete search history.

(56) References Cited

U.S. PATENT DOCUMENTS

| | | | | |
|---|---|---|---|---|
| 2009/0269521 A1* | 10/2009 | Tuma | ...................... | C23C 26/02 |
| | | | | 427/383.1 |
| 2014/0238646 A1* | 8/2014 | Enright | ................... | F28D 15/02 |
| | | | | 29/890.03 |
| 2018/0128553 A1* | 5/2018 | Lewis | ..................... | F28F 3/022 |
| 2019/0078847 A1* | 3/2019 | Joshi | .................. | H05K 7/20309 |

FOREIGN PATENT DOCUMENTS

| | | | | | | |
|---|---|---|---|---|---|---|
| CN | | 113825365 A | * | 12/2021 | ........... | F28D 15/046 |
| CN | | 113983842 A | * | 1/2022 | ........... | F28D 15/046 |
| CN | | 110418922 B | * | 8/2022 | ............. | F24F 11/74 |
| KR | | 20200036891 A | * | 4/2020 | ............. | C23C 18/38 |
| WO | WO-2010012798 A1 | | * | 2/2010 | ......... | H01L 23/3732 |
| WO | WO-2017089960 A1 | | * | 6/2017 | ......... | F28D 15/0233 |

* cited by examiner

*Primary Examiner* — Devon Lane

(74) *Attorney, Agent, or Firm* — Li & Cai Intellectual Property Office

(57) ABSTRACT

An immersion-type liquid cooling heat dissipation structure is provided. The immersion-type liquid cooling heat dissipation structure includes a metal heat dissipation substrate layer and a metal film layer. The metal film layer is formed on a surface of the metal heat dissipation substrate layer, and is configured to be immersed in an immersion-type coolant. An effective thickness of the metal film layer is less than 500 μm. A surface of the metal film layer has a plurality of micropores that facilitate generation of vapor bubbles. An effective width of each of the plurality of micropores is between 1 μm and 200 μm, and a depth of each of the plurality of micropores is between 100 nm and 50 μm.

12 Claims, 4 Drawing Sheets

IMMERSION-TYPE LIQUID COOLING HEAT DISSIPATION STRUCTURE

CROSS-REFERENCE TO RELATED PATENT APPLICATION

This application is a Continuation-in-Part application of the U.S. patent application Ser. No. 17/739,150, filed on May 8, 2022, and entitled "IMMERSION-TYPE LIQUID COOLING HEAT DISSIPATION STRUCTURE," the entire disclosures of which are incorporated herein by reference.

FIELD OF THE DISCLOSURE

The present disclosure relates to a heat dissipation structure, and more particularly to an immersion-type liquid cooling heat dissipation structure.

BACKGROUND OF THE DISCLOSURE

An immersion cooling technology is to directly immerse heat generating elements (such as servers and disk arrays) into a coolant that is non-conductive, and heat generated from operation of the heat generating elements is removed through an endothermic gasification process of the coolant. Since the heat flux of the heat generating elements is and will be rising as the demands for performance increase, how to dissipate heat more effectively through the immersion cooling technology has long been an issue to be addressed in the industry.

SUMMARY OF THE DISCLOSURE

In response to the above-referenced technical inadequacy, the present disclosure provides an immersion-type liquid cooling heat dissipation structure.

In one aspect, the present disclosure provides an immersion-type liquid cooling heat dissipation structure, which includes a metal heat dissipation substrate layer and a metal film layer. The metal film layer is formed on a surface of the metal heat dissipation substrate layer, and is configured to be immersed in an immersion-type coolant. An effective thickness of the metal film layer is less than 500 μm. At least a surface of the metal film layer has a plurality of micropores. An effective width of each of the plurality of micropores is between 1 μm and 200 μm, and a depth of each of the plurality of micropores is between 100 nm and 50 μm. The plurality of micropores are recessed from the surface of the metal film layer into the surface of the metal heat dissipation substrate layer, and at least some of the plurality micropores are in air communication with one another through the metal heat dissipation substrate layer, so as to increase an amount of bubbles that are generated through the plurality of micropores.

In certain embodiments, the at least some of the plurality of micropores are in air communication with one another through at least one channel that is formed by at least some of a plurality of inner holes of the metal heat dissipation substrate layer.

In certain embodiments, each of the plurality of inner holes is formed as a primary structure in the metal heat dissipation substrate when the metal heat dissipation substrate is formed.

In certain embodiments, each of the plurality of inner holes is formed as a secondary structure in the metal heat dissipation substrate by a secondary process after the metal heat dissipation substrate is formed.

In certain embodiments, a diameter of each of the plurality of inner hole formed in the metal heat dissipation substrate layer is between 5 μm and 50 μm.

In certain embodiments, the metal heat dissipation substrate layer is made of copper, aluminum, copper alloy, or aluminum alloy.

In certain embodiments, the metal heat dissipation substrate layer is formed by forging, casting, or joining of multiple metal members.

In certain embodiments, the metal film layer is made of nickel, copper, silver, zinc, titanium, iron, or alloys thereof.

In certain embodiments, the metal film layer is formed on the surface of the metal heat dissipation substrate layer by a wet process or a dry process.

In certain embodiments, each of the plurality of micropores is formed as a primary structure on the surface of the metal film layer when the metal film layer is formed.

In certain embodiments, each of the plurality of micropores is formed as a secondary structure on the surface of the metal film layer formed by a secondary process after the metal film layer is formed.

In certain embodiments, each of the plurality of micropores formed on the surface of the metal film layer has a primary structure micropore formed by a primary process and being randomly distributed, and a secondary structure micropore formed by a secondary process and being not randomly distributed.

In certain embodiments, the depth of each of the plurality of micropores formed on the surface of the metal film layer is less than or equal to the effective thickness of the metal film layer.

In certain embodiments, the depth of each of the plurality of micropores formed on the surface of the metal film layer is greater than the thickness of the metal film layer.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
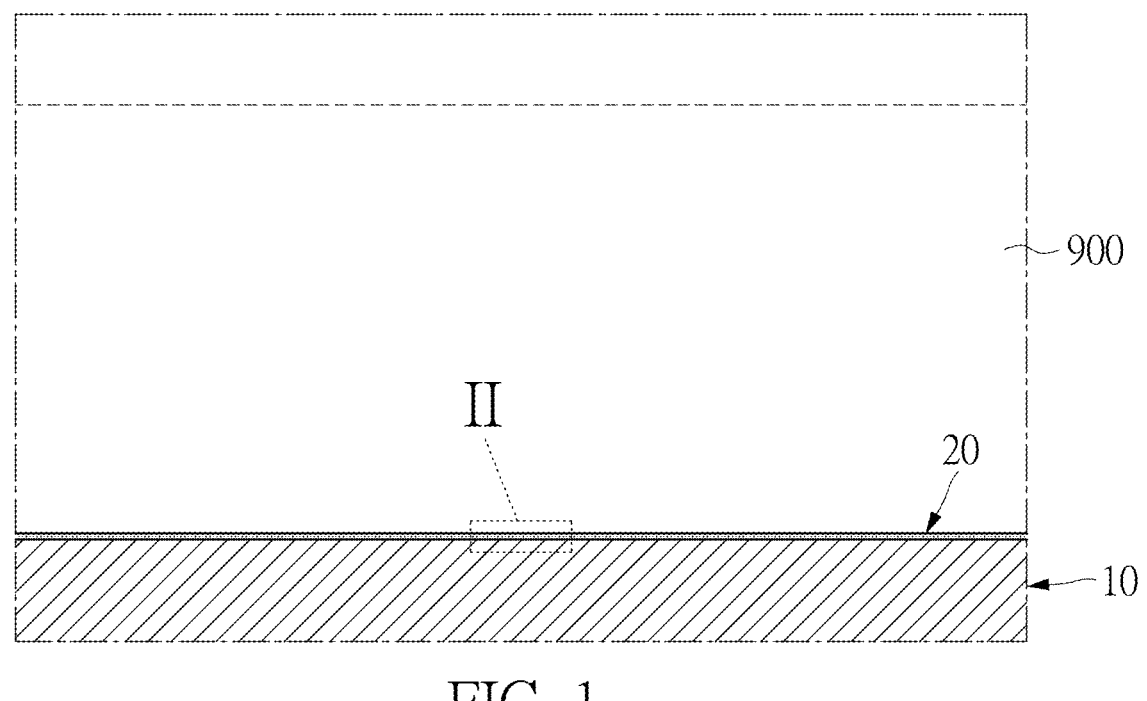
FIG. 1 is a schematic side view of an immersion-type liquid cooling heat dissipation structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
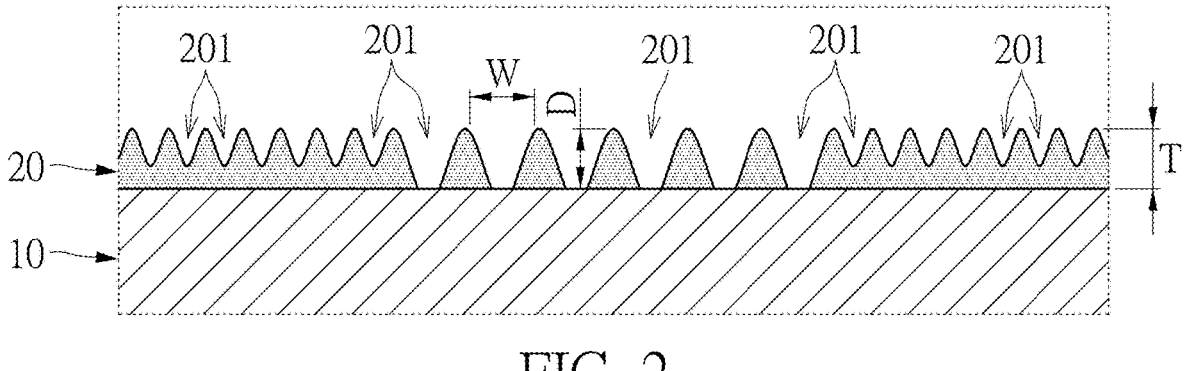
FIG. 2 is an enlarged view of part II of FIG. 1.

Reference is made to FIG. 1 and FIG. 2, in which a first embodiment of the present disclosure is shown. The first embodiment of the present disclosure provides an immersion-type liquid cooling heat dissipation structure that can be used for contacting a heat generating element. As shown in FIG. 1, the immersion-type liquid cooling heat dissipation structure provided in the present embodiment includes a metal heat dissipation substrate layer 10 and a metal film layer 20.

In the present embodiment, the metal heat dissipation substrate layer 10 can be made of a high thermally conductive substrate, such as copper, aluminum, copper alloy, or aluminum alloy. Further, the metal heat dissipation substrate layer 10 can be a forged metal member that is integrally formed by forging, or can be a cast metal member that is integrally formed by casting. Alternatively, the metal heat dissipation substrate layer 10 can be formed by joining of multiple metal members.

In the present embodiment, the metal film layer 20 can be made of nickel, copper, silver, zinc, titanium, iron, or alloys thereof. In addition, the metal film layer 20 is formed on the metal heat dissipation substrate layer 10, and can be immersed in an immersion-type coolant 900 (such as electronic fluorinated liquid). Further, the metal film layer 20 can be formed on a surface of the metal heat dissipation substrate layer 10 by a wet process (e.g., electroplating, chemical plating, and hot dip coating) or a dry process (e.g., sputtering and chemical vapor deposition).

In the present embodiment, in order to increase an amount of vapor bubbles through the metal film layer 20, a thickness T of the metal film layer 20 that is effective needs to be less than 500 μm. Further, a surface of the metal film layer 20 has a plurality of micropores 201 that can facilitate generation of the vapor bubbles. A width W of each of the plurality of micropores 201 that is effective is between 1 μm and 200

μm, and a depth D of each of the plurality of micropores 201 that is effective is between 100 nm and 50 μm.

In the present embodiment, according to experimental results, the thickness T of the metal film layer 20 that is effective is preferably between 500 nm and 5 μm, the width W of each of the plurality of micropores 201 that is effective on the surface of the metal film layer 20 is preferably between 5 μm and 50 μm, and the depth D of each of the plurality of micropores 201 that is effective is preferably between 250 nm and 10 μm. Accordingly, generation of the vapor bubbles can be effectively increased, so as to increase an immersion-type heat dissipation effect of the immersion-type liquid cooling heat dissipation structure.

Specifically, each of the plurality of micropores 201 formed on the surface of the metal film layer 20 can be a primary structure formed when the metal film layer 20 is formed. That is, the micropore 201 is a primary structure micropore formed by a primary process. Further, a masking area can be formed on the metal heat dissipation substrate layer 10 by printing ink or by masking with a jig, so that the primary structure micropores are simultaneously formed when the metal film layer 20 is formed on the surface of the metal heat dissipation substrate layer 10. In addition, by spraying metal particles, the primary structure micropores can be simultaneously formed when the metal film layer 20 is formed on the metal heat dissipation substrate layer 10. Alternatively, through local concentration of electric current during coating, the primary structure micropores can be simultaneously formed when the metal film layer 20 is formed on the metal heat dissipation substrate layer 10.

Further, each of the plurality of micropores 201 formed on the surface of the metal film layer 20 can also be a secondary structure formed by a secondary process after the metal film layer 20 is formed. That is, the micropore 201 is a secondary structure micropore formed by the secondary process. Specifically, the secondary structure micropore can be formed on the surface of the metal film layer 20 by chemical etching or laser etching. Alternatively, the secondary structure micropore can be formed on the surface of the metal film layer 20 by sand blasting or by a computer numerical control (CNC) processing.

Moreover, each of the plurality of micropores 201 formed on the surface of the metal film layer 20 may have the primary structure micropore formed by the primary process that is randomly distributed, and the secondary structure micropore formed by the secondary process that is not randomly distributed (i.e., formed in a predetermined area). In this way, the width of the micropore, the depth of the micropore, and a number of the micropores in the predetermined area (e.g., a heat source area) can be more effectively controlled.

In addition, a depth of the primary structure micropore can be less than the thickness T of the metal film layer 20, and a depth of the secondary structure micropore can be equal to the thickness T of the metal film layer 20, but are not limited thereto.

Second Embodiment

Figure 3:
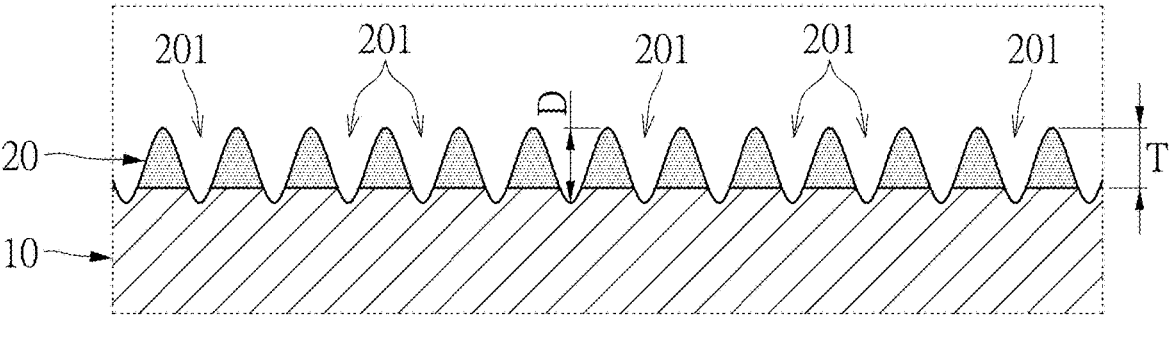
FIG. 3 is an enlarged view of an immersion-type liquid cooling heat dissipation structure according to a second embodiment of the present disclosure.

Reference is made to FIG. 3, in which a second embodiment of the present disclosure is shown. The second embodiment is substantially the same as the first embodiment, and differences therebetween are described as follows.

In the present embodiment, the depth D of each of the plurality of micropores 201 formed on the surface of the metal film layer 20 is greater than the thickness T of the metal film layer 20. That is, the plurality of micropores 201 are recessed from the surface of the metal film layer 20 into the surface of the metal heat dissipation substrate layer 10, so that the immersion-type heat dissipation effect of the immersion-type liquid cooling heat dissipation structure can be further increased.

Third Embodiment

Figure 4:
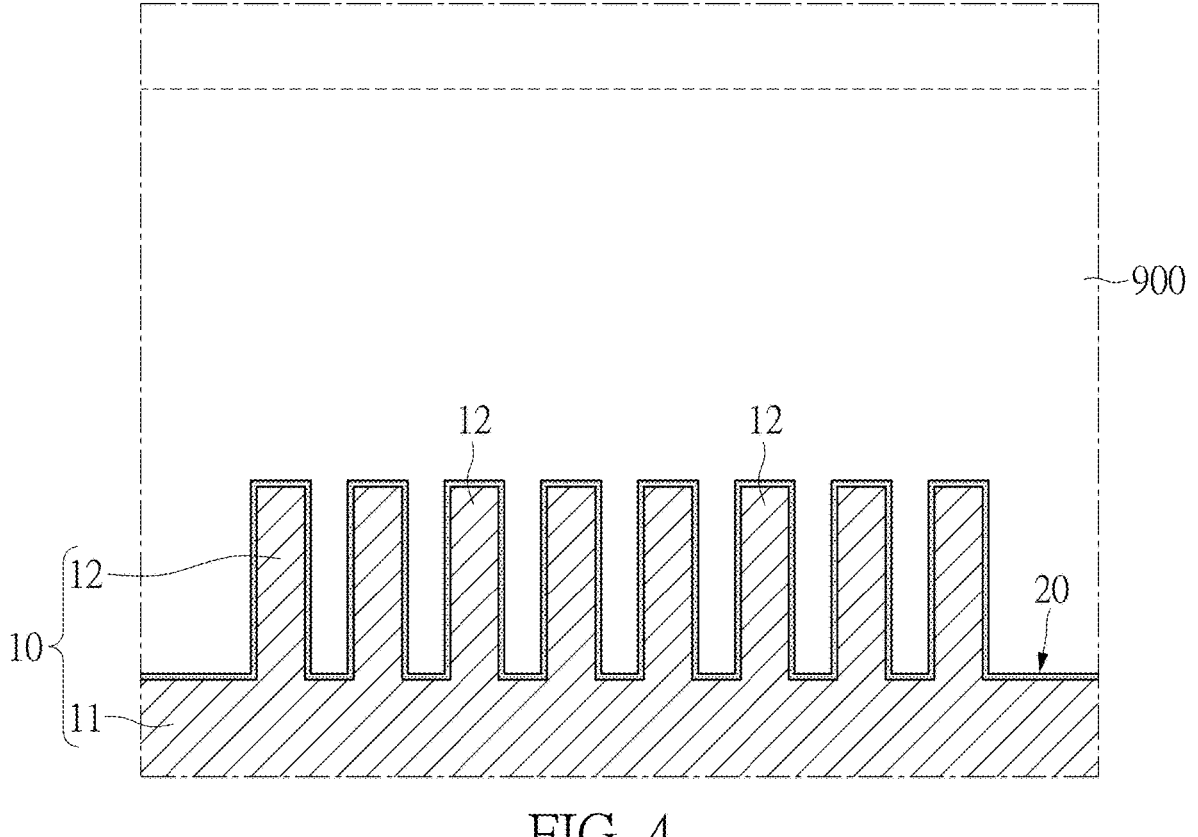
FIG. 4 is a schematic side view of an immersion-type liquid cooling heat dissipation structure according to a third embodiment of the present disclosure.

Reference is made to FIG. 4, in which a third embodiment of the present disclosure is shown. The third embodiment is substantially the same as the first embodiment, and differences therebetween are described as follows.

In the present embodiment, the metal heat dissipation substrate layer 10 includes a heat dissipation block 11 and a plurality of fins 12 that are perpendicular to the heat dissipation block 11. Each of the plurality of fins 12 of the present embodiment is exemplified as a pin fin, but can also be a plate fin, a composite fin of the above-mentioned pin fin and plate fin, or a fin of other geometric shapes, so as to increase a heat dissipation surface area of the immersion-type liquid cooling heat dissipation structure.

Further, the metal film layer 20 is correspondingly formed on a surface of the heat dissipation block 11 and a surface of each of the plurality of fins 12. In addition, a number of the micropores 201 of the metal film layer 20 formed on the surfaces of the plurality of fins 12 can be greater than a number of the micropores 201 of the metal film layer 20 formed on the surface of the heat dissipation block 11.

Fourth Embodiment

Figure 5:
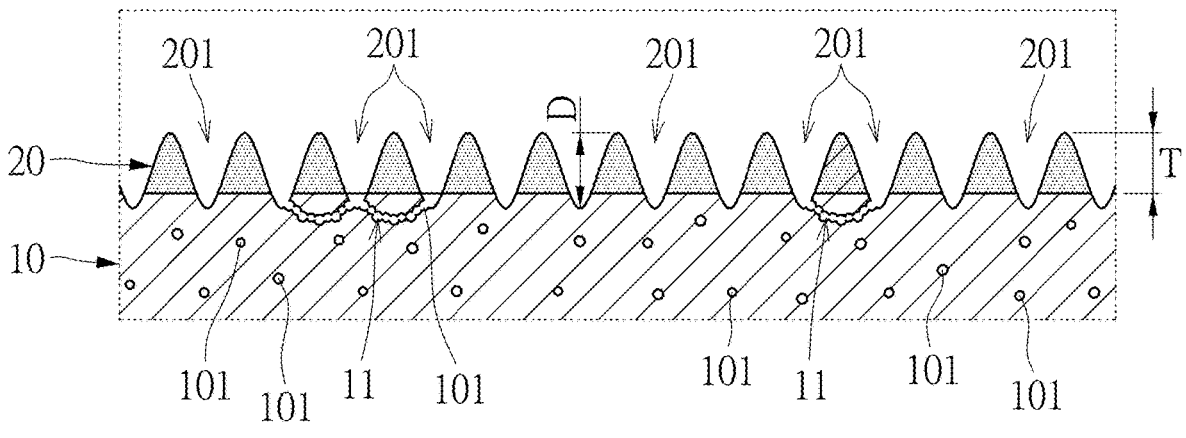
FIG. 5 is an enlarged view of an immersion-type liquid cooling heat dissipation structure according to a fourth embodiment of the present disclosure.

Reference is made to FIG. 5, in which a fourth embodiment of the present disclosure is shown. The fourth embodiment is substantially the same as the first embodiment, and differences therebetween are described as follows.

In the present embodiment, the plurality of micropores 201 are recessed from the surface of the metal film layer 20 into the surface of the metal heat dissipation substrate layer 10, and at least some of the plurality of micropores 201 are in air communication with one another through the metal heat dissipation substrate layer 10, so as to increase an amount of bubbles that are generated through the plurality of micropores 201.

Specifically, the at least some of the plurality of micropores 201 are in air communication with one another through at least one channel 11 that is formed by at least some of a plurality of inner holes 101 of the metal heat dissipation substrate layer 10. Each of the plurality of inner holes 101 can be formed as a primary structure in the metal heat dissipation substrate layer 10 when the metal heat dissipation substrate layer 10 is formed.

Further, each of the plurality of inner holes 101 formed in the metal heat dissipation substrate layer 10 can also be a secondary structure formed by a secondary process after the metal heat dissipation substrate layer 10 is formed. That is, the inner hole 101 is a secondary structure hole formed by the secondary process. Specifically, the secondary structure hole can be formed in the metal heat dissipation substrate layer 10 by chemical etching, laser etching, or a computer numerical control (CNC) processing. In this way, the size of each of the inner holes 101 and a number of the inner holes 101 in the predetermined area (e.g., a heat source area) can be more effectively controlled.

Moreover, a diameter of each of the plurality of inner hole 101 formed in the metal heat dissipation substrate layer 10 is between 5 μm and 50 μm, so that a thermal resistance of the immersion-type liquid cooling heat dissipation structure is greatly reduced and the heat dissipation capacity of the immersion-type liquid cooling heat dissipation structure is significantly improved.

Beneficial Effects of the Embodiments

In conclusion, in the immersion-type liquid cooling heat dissipation structure provided by the present disclosure, by virtue of "the immersion-type liquid cooling heat dissipation structure includes the metal heat dissipation substrate layer and the metal film layer," "the metal film layer is formed on the surface of the metal heat dissipation substrate layer, and is configured to be immersed in the immersion-type coolant," "the effective thickness of the metal film layer is less than 500 μm," and "at least the surface of the metal film layer has the plurality of micropores, the effective width of each of the plurality of micropores is between 1 μm and 200 μm, and the depth of each of the plurality of micropores is between 100 nm and 50 μm," the vapor bubbles that are generated can be effectively increased, so as to increase the immersion-type heat dissipation effect of the immersion-type liquid cooling heat dissipation structure.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An immersion-type liquid cooling heat dissipation structure, comprising:
   a metal heat dissipation substrate layer; and
   a metal film layer;
   wherein the metal film layer is formed on a surface of the metal heat dissipation substrate layer, and is configured to be immersed in an immersion-type coolant;
   wherein an effective thickness of the metal film layer is less than 500 μm;
   wherein at least a surface of the metal film layer has a plurality of micropores, an effective width of each of the plurality of micropores is between 1 μm and 200 μm, and a depth of each of the plurality of micropores is between 100 nm and 50 μm;
   wherein the plurality of micropores are recessed from the surface of the metal film layer into the surface of the metal heat dissipation substrate layer, and at least some of the plurality micropores are in air communication with one another through the metal heat dissipation substrate layer, so as to increase an amount of bubbles that are generated through the plurality of micropores.

2. The immersion-type liquid cooling heat dissipation structure according to claim 1, wherein the at least some of the plurality of micropores are in air communication with one another through at least one channel that is formed by at least some of a plurality of inner holes of the metal heat dissipation substrate layer.

3. The immersion-type liquid cooling heat dissipation structure according to claim 2, wherein each of the plurality of inner holes is formed as a primary structure in the metal heat dissipation substrate when the metal heat dissipation substrate is formed.

4. The immersion-type liquid cooling heat dissipation structure according to claim 2, wherein each of the plurality of inner holes is formed as a secondary structure in the metal heat dissipation substrate by a secondary process after the metal heat dissipation substrate is formed.

5. The immersion-type liquid cooling heat dissipation structure according to claim 2, wherein a diameter of each of the plurality of inner holes formed in the metal heat dissipation substrate layer is between 5 μm and 50 μm.

6. The immersion-type liquid cooling heat dissipation structure according to claim 1, wherein the metal heat dissipation substrate layer is made of copper, aluminum, copper alloy, or aluminum alloy.

7. The immersion-type liquid cooling heat dissipation structure according to claim 6, wherein the metal heat dissipation substrate layer is formed by forging, casting, or joining of multiple metal members.

8. The immersion-type liquid cooling heat dissipation structure according to claim 1, wherein the metal film layer is made of nickel, copper, silver, zinc, titanium, iron, or alloys thereof.

9. The immersion-type liquid cooling heat dissipation structure according to claim 8, wherein the metal film layer is formed on the surface of the metal heat dissipation substrate layer by a wet process or a dry process.

10. The immersion-type liquid cooling heat dissipation structure according to claim 9, wherein each of the plurality of micropores is formed as a primary structure on the surface of the metal film layer when the metal film layer is formed.

11. The immersion-type liquid cooling heat dissipation structure according to claim 9, wherein each of the plurality of micropores is formed as a secondary structure on the surface of the metal film layer by a secondary process after the metal film layer is formed.

12. The immersion-type liquid cooling heat dissipation structure according to claim 9, wherein each of the plurality of micropores formed on the surface of the metal film layer has a primary structure micropore formed by a primary process and being randomly distributed, and a secondary structure micropore formed by a secondary process and not being randomly distributed.

* * * * *